United States Patent
Demos et al.

(10) Patent No.: US 6,831,284 B2
(45) Date of Patent: Dec. 14, 2004

(54) LARGE AREA SOURCE FOR UNIFORM ELECTRON BEAM GENERATION

(75) Inventors: Alexandros T. Demos, San Ramon, CA (US); Hari K. Ponnekanti, San Jose, CA (US); Jun Zhao, Cupertino, CA (US); Helen R. Armer, Cupertino, CA (US); William R. Livesay, San Diego, CA (US); Scott C. Woods, Poway, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/301,508

(22) Filed: Nov. 21, 2002

(65) Prior Publication Data

US 2004/0099817 A1 May 27, 2004

(51) Int. Cl.[7] .................................................. G21K 5/02
(52) U.S. Cl. ............................. 250/492.3; 250/492.23; 250/398
(58) Field of Search ...................... 250/492.3, 492.23, 250/398

(56) References Cited

U.S. PATENT DOCUMENTS

| | | | | |
|---|---|---|---|---|
| 3,878,428 A | * | 4/1975 | Kuzminski et al. | 313/408 |
| 4,045,677 A | * | 8/1977 | Humphries et al. | 250/423 R |
| 5,003,178 A | * | 3/1991 | Livesay | 250/492.3 |
| 5,414,267 A | | 5/1995 | Wakalopulos | 250/492.3 |
| 5,496,200 A | * | 3/1996 | Yang et al. | 445/25 |
| RE35,203 E | | 4/1996 | Wakalopulos | 250/492.3 |
| 6,407,399 B1 | | 6/2002 | Livesay | 250/492.3 |
| 6,429,445 B1 | * | 8/2002 | Kim et al. | 250/492.3 |
| 6,506,289 B2 | * | 1/2003 | Demaray et al. | 204/192.26 |
| 6,607,991 B1 | * | 8/2003 | Livesay et al. | 438/787 |
| 2002/0038999 A1 | * | 4/2002 | Cao et al. | 313/503 |

* cited by examiner

Primary Examiner—Nikita Wells
Assistant Examiner—Anthony Quash
(74) Attorney, Agent, or Firm—Moser, Patterson & Sheridan

(57) ABSTRACT

An electron beam apparatus that includes a vacuum chamber, a large-area cathode disposed in the vacuum chamber, and a first power supply connected to the cathode. The first power supply is configured to apply a negative voltage to the cathode sufficient to cause the cathode to emit electrons toward a substrate disposed in the vacuum chamber. The electron beam apparatus further includes an anode positioned between the large-area cathode and the substrate. The anode is made from aluminum. The electron beam apparatus further includes a second power supply connected to the anode, wherein the second power supply is configured to apply a voltage to the anode that is positive relative to the voltage applied to the cathode.

47 Claims, 3 Drawing Sheets

LARGE AREA SOURCE FOR UNIFORM ELECTRON BEAM GENERATION

BACKGROUND OF THE INVENTION

1. Field of the Invention

Embodiments of the present invention relate to the fabrication of integrated circuits. More particularly, embodiments of the present invention relate to a process for depositing dielectric layers on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 $\mu$m and even 0.1 $\mu$m feature sizes, and tomorrow's facilities will soon be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, un-doped silicon glass (USG), fluorine-doped silicon glass (FSG), and polytetrafluoroethylene (PTFE), which are all commercially available.

An effective method to lower the k value is to introduce pores into the film. Consequently, however, low k films often have a low mechanical strength (e.g., hardness), which may hinder the integration of the films into the manufacture of the device. Electron beam post treatment is currently being used to increase the mechanical strength of low k films. One example of an electron beam apparatus used to treat low k films is a large-area electron source, which includes an anode that is typically made from graphite. It has recently been observed, however, that graphite anodes tend to bow or break in response to varying temperatures during treatment, which may result in particle contamination on the films.

Therefore, a need exists for a method and apparatus of an improved electron beam apparatus for treating low k films.

SUMMARY OF THE INVENTION

Embodiments of the present invention are generally directed to an electron beam apparatus. In one embodiment, the electron beam apparatus includes a vacuum chamber, a large-area cathode disposed in the vacuum chamber, and a first power supply connected to the cathode. The first power supply is configured to apply a negative voltage to the cathode sufficient to cause the cathode to emit electrons toward a substrate disposed in the vacuum chamber. The electron beam apparatus further includes an anode positioned between the large-area cathode and the substrate. The anode is made from aluminum. The electron beam apparatus further includes a second power supply connected to the anode, wherein the second power supply is configured to apply a voltage to the anode that is positive relative to the voltage applied to the cathode.

In another embodiment of the invention, the electron beam apparatus includes a vacuum chamber in which an interior portion of the vacuum chamber is one of bead blasted, roughened, anodized or darkened. The electron beam apparatus further includes a large-area cathode disposed in the vacuum chamber, a first power supply connected to the cathode. The first power supply is configured to apply a negative voltage to the cathode sufficient to cause the cathode to emit electrons toward a substrate disposed in the vacuum chamber. The electron beam apparatus further includes an anode positioned between the large-area cathode and the substrate, and a second power supply connected to the anode. The second power supply is configured to apply a voltage to the anode that is positive relative to the voltage applied to the cathode.

In yet another embodiment of the invention, the electron beam apparatus includes a vacuum chamber, a large-area cathode disposed in the vacuum chamber, and a first power supply connected to the cathode. The first power supply is configured to apply a negative voltage to the cathode sufficient to cause the cathode to emit electrons toward a substrate disposed in the vacuum chamber. The electron beam chamber further includes an anode placed between the large-area cathode and the substrate, and a shelf disposed in the vacuum chamber. The shelf defines a surface on which the anode is placed. The electron beam chamber further includes a second power supply connected to the anode. The second power supply is configured to apply a voltage to the anode that is positive relative to the voltage applied to the cathode.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

A detailed description will now be provided. Various terms as used herein are defined below. To the extent a term used in a claim is not defined below, it should be given the broadest definition persons in the pertinent art have given that term, as reflected in printed publications and issued patents. Embodiments of the present invention are generally directed to an apparatus and method for treating low dielectric constant films, such as carbon-doped oxide films, with an electron beam (e-beam).

Figure 1:
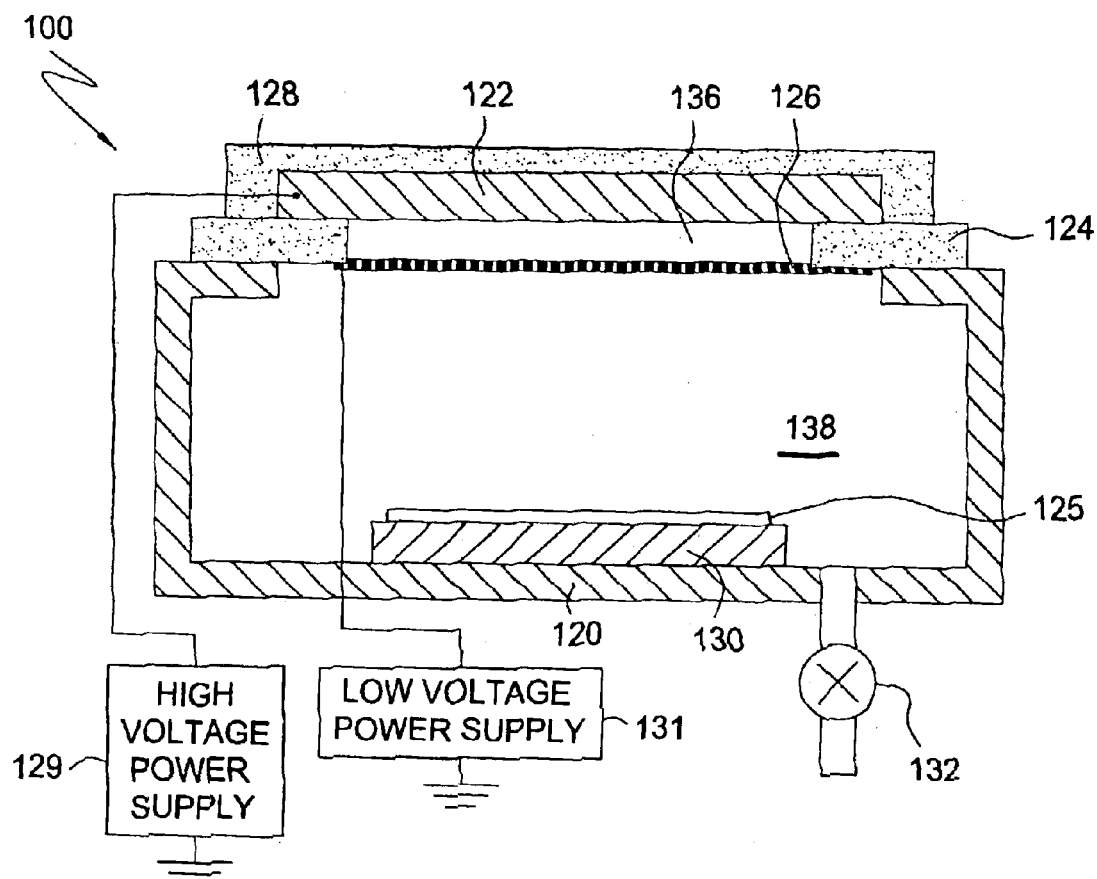
FIG. 1 is an electron beam chamber in accordance with an embodiment of the invention.

FIG. 1 illustrates an e-beam chamber 100 in accordance with an embodiment of the invention. The e-beam chamber 100 includes a vacuum chamber 120, a large-area cathode 122, a target plane 130 located in a field-free region 138, and a grid anode 126 positioned between the target plane 130 and the large-area cathode 122. The large-area cathode 122 may range from about one to about 23 inches wide. The e-beam chamber 100 further includes a high voltage insulator 124 for isolating the grid anode 126 from the large-area cathode 122, a cathode cover insulator 128 located outside the vacuum chamber 120, a variable leak valve 132 for controlling the pressure inside the vacuum chamber 120, a variable high voltage power supply 129 connected to the large-area cathode 122, and a variable low voltage power supply 131 connected to the grid anode 126.

In operation, a substrate 125, which is configured to be treated with the electron beam, is placed on the target plane 130. The vacuum chamber 120 is pumped from atmospheric pressure to a pressure in the range of about 1 mTorr to about 100 mTorr. The exact pressure is controlled by the variable rate leak valve 132, which is capable of controlling pressure to about 0.1 mTorr. The electron beam is generally emitted at a sufficiently high voltage, which is applied to the large-area cathode 122 by the variable high voltage power supply 129. The voltage generated by the high voltage power supply 129 may range from about −1000 volts to about −30,000 volts. The high voltage power supply 129 may be a Bertan Model #105-30R manufactured by Bertan of Hickville, N.Y., or a Spellman Model #SL30N-1200X 258 manufactured by Spellman High Voltage Electronics Corp., of Hauppauge, N.Y. The variable low voltage power supply 131 is configured to apply a voltage to the grid anode 126 that is positive relative to the voltage applied to the large-area cathode 122, such as from about 0 volts to about −250 volts. This voltage is generally used to control electron emission from the large-area cathode 122. The variable low voltage power supply 131 may be an Acopian Model #150PT12 power supply available from Acopian of Easton, Pa.

Figure 2:
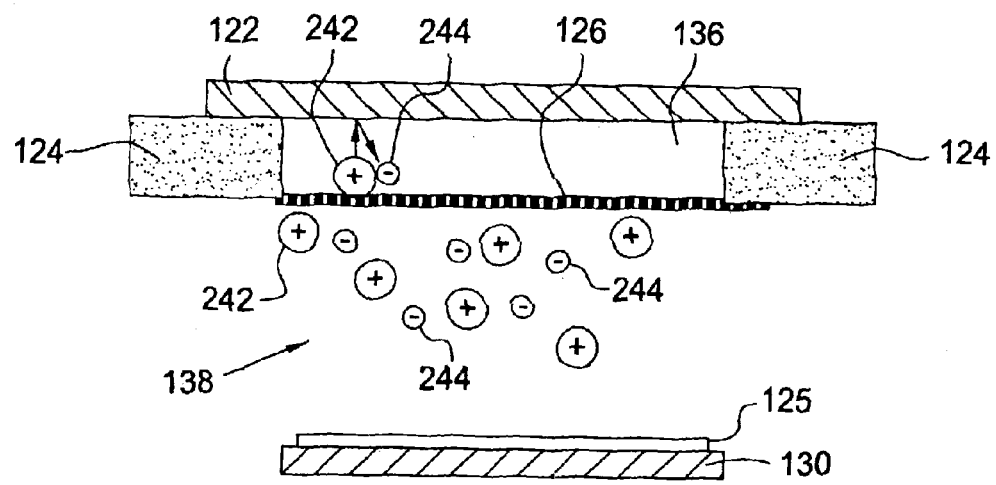
FIG. 2 is a fragmentary view of the electron beam chamber in accordance with an embodiment of the invention.

To initiate electron emission, the gas in the field-free region 138 between the grid anode 126 and the target plane 130 must be ionized, which may occur as a result of naturally occurring gamma rays. Ionization may also be artificially initiated inside the vacuum chamber 120 by a high voltage spark gap. Following the initial ionization, the grid anode 126 is biased with a slightly negative voltage, e.g., from about 0 to about −250 volts, to attract the positive ions 242 (shown in FIG. 2) to the grid anode 126. These positive ions 242 pass into an accelerating field region 136, disposed between the large-area cathode 122 and the grid anode 126, and are accelerated towards the large-area cathode 122 as a result of the high voltage (e.g., from about −1000 volts to about −30,000 volts) applied to the large-area cathode 122. Upon striking the large-area cathode 122, these high-energy ions 242 produce secondary electrons 244, which are accelerated back toward the grid anode 126. Some of these electrons 244, which travel generally perpendicular to the cathode surface, strike the grid anode 126, but many of these electrons 244 pass through the grid anode 126 and travel to the target plane 130. These secondary electrons 244 in turn ionize the gas molecules in the field-free region 138 between the grid anode 126 and the substrate 125. The grid anode 126 is generally positioned at a distance less than the mean free path of the electrons emitted by the large-area cathode 122. For example, the grid anode 126 may be positioned less than about 4 mm from the large-area cathode 122. Due to the short distance between the grid anode 126 and the large-area cathode 122, no, or minimal, ionization takes place in the accelerating field region 136 between the grid anode 126 and the large-area cathode 122.

In a conventional gas discharge device, the electrons would create further positive ions in the accelerating field region 136, which would be attracted to the large-area cathode 122, creating even more electron emission. The discharge could easily avalanche into an unstable high voltage breakdown. However, in accordance with an embodiment of the invention, the positive ions 242 created outside the grid anode 126, i.e., in the accelerating field region 136, may be controlled (repelled or attracted) by the voltage applied to the grid anode 126. In this manner, the electron emission may be continuously controlled by varying the voltage on the grid anode 126. Alternatively, the electron emission may be controlled by the variable leak valve 132, which is configured to raise or lower the number of molecules in the ionization region between the target plane 130 and the large-area cathode 122.

With respect to heating the substrate 125, the substrate 125 is generally heated with a heating apparatus (not shown), such as a plurality of infrared lamps. Invariably, some of the thermal radiation from the lamps is reflected of the vacuum chamber 120 into the grid anode 126. Continual exposure of the reflected thermal radiation to the grid anode 126 may eventually cause the grid anode 126 to overheat. Accordingly, an internal portion of the vacuum chamber 120 may be bead blasted, darkened, roughened, or anodized to increase the absorptivity of the internal portion of the chamber to be greater than about 0.5. In this manner, most of the thermal radiation from the lamps is absorbed by the vacuum chamber 120.

Figure 3:
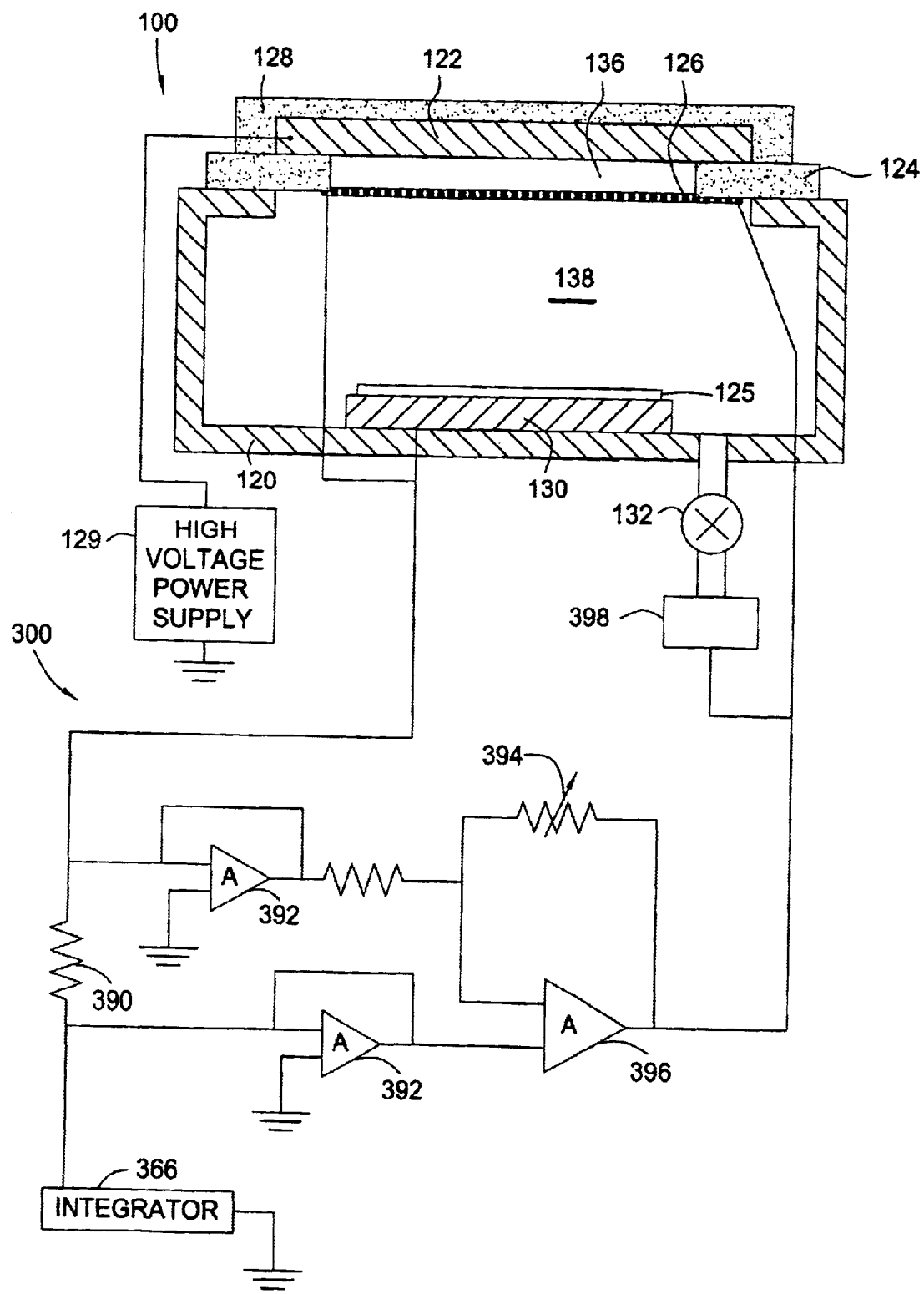
FIG. 3 illustrates the electron beam chamber with a feedback control circuit in accordance with an embodiment of the invention.

FIG. 3 illustrates the e-beam chamber 100 with a feedback control circuit 300. In some applications it may be desirable to provide a constant beam current at different electron beam energies. For example, it may be desirable to expose or cure the upper layer of the film formed on the substrate, but not the bottom layer. This may be accomplished by lowering the electron beam energy such that most of the electrons are absorbed in the upper layer of the film. Subsequent to curing the upper layer, it may be desirable to cure the full thickness of the film. This can be done by raising the accelerating voltage of electron beam to penetrate completely through the film. The feedback control circuit 300 is configured to maintain a constant beam current independent of changes in the accelerating voltage. The feedback control circuit 300 includes an integrator 366. The beam current is sampled via a sense resistor 390, which is placed between the target plane 130 and the integrator 366. The beam current may also be sampled at the grid anode 126 as a portion of the beam is intercepted there. Two unity gain voltage followers 392 buffer the signal obtained across the sense resistor 390 and feed it to an amplifier 396 with a variable resistor 394. The output of this amplifier controls the voltage on the grid anode 126 such that an increase in beam current will cause a decrease in bias voltage on the grid anode 126. The gain of the amplifier 396 may be adjusted, by means of the variable resistor 394, so that any change in beam current caused by a change in the accelerating voltage is counteracted by a change in bias voltage on the grid anode 126, thereby maintaining a constant beam current at the substrate. Alternatively, the output of the amplifier 396 may be connected to a voltage controlled variable rate leak valve 398 to counteract changes in beam current by raising or lowering the pressure in the ionization region 138. A wider range of beam current control may be provided by utilizing feedback signals to both the variable leak valve 398 and the grid anode 126. Other details of the e-beam chamber 100 are described in U.S. Pat. No. 5,000,178, entitled "Large-Area Uniform Electron Source", issued to William R. Livesay, assigned to Electron Vision Corporation (which is currently owned by the assignee of the present invention) and is incorporated by reference herein to the extent not inconsistent with the invention.

Figure 4:
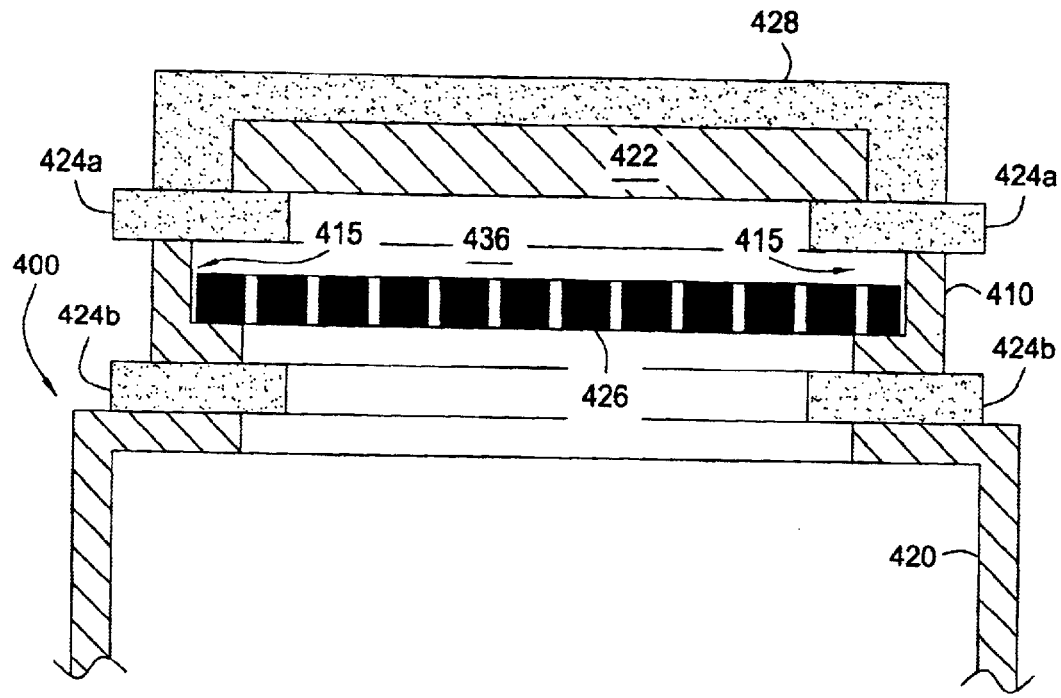
FIG. 4 is a partial cross sectional view of an electron beam chamber in accordance with an embodiment of the invention.

FIG. 4 illustrates a partial cross sectional view of an e-beam chamber 400 in accordance with an embodiment of the invention. The e-beam chamber 400 includes a vacuum chamber 420, a large-area cathode 422, an upper insulator 424a and a lower insulator 424b, and a shelf 410 positioned between the upper insulator 424a and the lower insulator 424b. A grid anode 426 is positioned on the shelf 410 across the vacuum chamber 420 such that a space 415 is defined above the grid anode 426 and around a perimeter of the grid anode 426. In this manner, the grid anode 426 is free to move in the space 415 to reduce the stress associated with expansion and contraction of the grid anode 426 caused by the varying temperatures during operation of the e-beam chamber 400. This configuration in turn minimizes the likelihood of the grid anode 426 from bowing and maintains the collimation of the grid anode 426 uniform. In one embodiment, the grid anode 426 and the shelf 410 are merely held together by gravity.

The grid anode, such as the grid anode 126 or 426, may be made from any electrically conductive material, such as graphite and aluminum. Since carbon-doped oxide films are typically treated at high temperatures (e.g., 200–600 degrees Celsius), aluminum, in general, provides a more suitable material for the grid anode than graphite. For instance, aluminum generally has a higher thermal conductivity than graphite. Consequently, a grid anode made of aluminum bows less at high temperatures (e.g., 400 degrees Celsius) than a grid anode made of graphite, thereby creating a more diametrically uniform electron beam. Aluminum generally also has a lower absorptivity than graphite, which leads to a lesser radiation heat transfer from the substrate to the anode, thereby causing the anode to heat slower. For example, at a temperature treatment of 400 degrees Celsius, the temperature of graphite anodes rises to about 340 degrees Celsius, while the temperature of aluminum anodes rises to only about 140 degrees Celsius. Furthermore, aluminum anodes generally generate more electrons than graphite anodes. This benefit allows the vacuum chamber, such as the vacuum chamber 120, to operate at a lower pressure for a given beam current, thereby increasing the efficiency of the chamber. Moreover, aluminum has a lower sputtering yield than graphite, thereby resulting in less contamination on the films. In addition to the grid anode being made from aluminum, the large-area cathode (e.g., the large-area cathode 122), the vacuum chamber (e.g., the vacuum chamber 120) and the shelf 410 may also be made from aluminum.

Figure 5A:
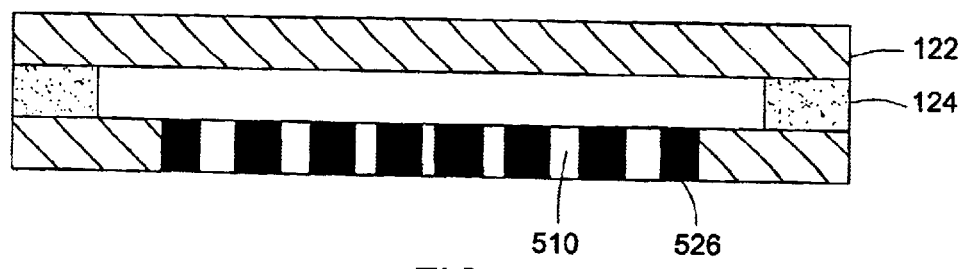
FIGS. 5A–B illustrate cross sectional views of a grid anode with an array of holes in accordance with various embodiments of the invention.
Figure 5B:
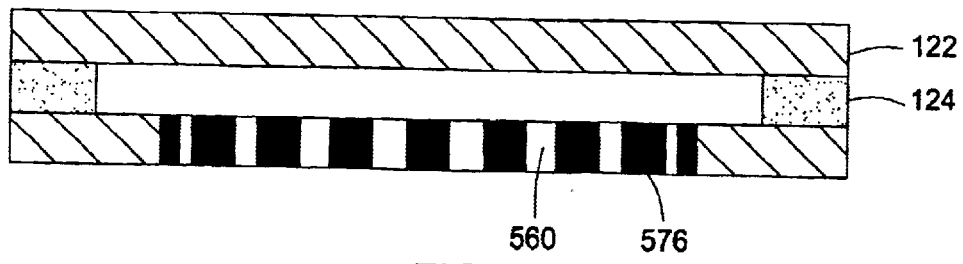

The grid anode may also have an array of holes disposed therethrough. The size of the holes may be varied to compensate for a decrease in beam intensity that typically occurs at an edge of the grid anode. In this manner, the large-area cathode, such as the large-area cathode 122, may be configured to generate a more diametrically uniform electron beam. In accordance with one embodiment, FIG. 5A illustrates a grid anode 526 with an array of holes 510 whose diameter gradually increases from the center of the grid anode 526 to the edge of the grid anode 526. In accordance with another embodiment, FIG. 5B illustrates a grid anode 526 with an array of holes 560 whose diameter gradually decreases from the center of the grid anode 526 to the edge of the grid anode 526. Examples for the array of holes and methods for making the holes are described in more detail in U.S. Pat. No. 6,407,399, entitled "Uniformity Correction For Large Area Electron Source", issued to William R. Livesay, assigned to Electron Vision Corporation (which is currently owned by the assignee of the present invention) and is incorporated by reference herein to the extent not inconsistent with the invention.

The temperature at which the e-beam chamber typically operates ranges from about −200 degrees Celsius to about 600 degrees Celsius, e.g., about 200 degrees Celsius to about 400 degrees Celsius. The electron beam energy ranges from about 0.5 KeV to about 30 KeV. The exposure dose ranges from about 1 $\mu C/cm^2$ to about 400 $\mu C/cm^2$, and more preferably between about 50 to about 200 $\mu C/cm^2$, such as about 70 $\mu C/cm^2$. The electron beams are generally generated at a pressure of about 1 mTorr to about 100 mTorr. The gas ambient in the electron beam chamber may be any of the following gases: nitrogen, oxygen, hydrogen, argon, a blend of hydrogen and nitrogen, ammonia, xenon, or any combination of these gases. The electron beam current ranges from about 1 mA to about 40 mA, and more preferably from about 5 mA to about 20 mA. The electron beam may cover an area from about 4 square inches to about 700 square inches.

While the foregoing is directed to embodiments of the present invention, other and further embodiments of the invention may be devised without departing from the basic scope thereof, and the scope thereof is determined by the claims that follow.

What is claimed is:

1. An electron beam apparatus, comprising:
   a vacuum chamber;
   a large-area cathode disposed in the vacuum chamber;
   a first power supply connected to the cathode, wherein the first power supply is configured to apply a negative voltage to the cathode sufficient to cause the cathode to emit electrons toward a substrate disposed in the vacuum chamber;
   an aluminum anode positioned between the large-area cathode and the substrate, the anode being positioned on an upper surface of an electrically isolated shelf that projects inwardly from an interior portion of the vacuum chamber; and
   a second power supply connected to the anode, wherein the second power supply is configured to apply a voltage to the anode that is positive relative to the voltage applied to the cathode.

2. The apparatus of claim 1, wherein the interior portion of the vacuum chamber is one of bead blasted, roughened, anodized or darkened.

3. The apparatus of claim 1, wherein the interior portion of the vacuum chamber has an absorptivity of greater than about 0.5.

4. The apparatus of claim 1, wherein the first power supply is configured to apply a voltage ranging from about −1000 volts to about −30,000 volts.

5. The apparatus of claim 1, wherein the second power supply is to apply a voltage ranging from about 0 volts to about −250 volts.

6. The apparatus of claim 1, wherein the large-area cathode emits the electrons when the large-area cathode is struck with positive ions.

7. The apparatus of claim 1, wherein the negative voltage applied to the large-area cathode is configured to attract positive ions to the large-area cathode; and wherein the electrons are emitted in response to the positive ions striking the large-area cathode.

8. The apparatus of claim 1, wherein an interior portion of the vacuum chamber has an absorptivity of greater than about 0.5; and wherein the anode is freely positioned on the shelf.

9. The apparatus of claim 1, wherein the shelf for laying the anode defines a space around a perimeter of the anode; and wherein an interior portion of the vacuum chamber is one of bead blasted, roughened, anodized or darkened.

10. The apparatus of claim 1, wherein the anode defines a plurality of holes disposed therethrough; and wherein an interior portion of the vacuum chamber is one of bead blasted, roughened, anodized or darkened.

11. The apparatus of claim 1, wherein the anode is placed on the shelf that defines a space around a perimeter of the anode and above the anode to allow the anode to expand and contract without bowing in response to varying temperatures during operation of the electron beam apparatus; and wherein an interior portion of the vacuum chamber is one of bead blasted, roughened, anodized or darkened.

12. The apparatus of claim 11, wherein the interior portion of the vacuum chamber has an absorptivity of greater than about 0.5.

13. The apparatus of claim 1, wherein the anode defines a plurality of holes disposed therethrough.

14. The apparatus of claim 13, wherein the plurality of holes have a diameter that gradually decreases from a center of the anode to an edge of the anode.

15. The apparatus of claim 13, wherein the plurality of holes have a diameter that gradually increases from a center of the anode to an edge of the anode.

16. The apparatus of claim 1, wherein the anode and shelf are configured to allow both vertical and horizontal expansion of the anode, while maintaining a substantially planar upper surface of the anode, under varying thermal conditions.

17. The apparatus of claim 16, wherein the shelf defines a space around a perimeter of the anode.

18. The apparatus of claim 16, wherein at least one of the vacuum chamber, the large-area cathode or the shelf is made from aluminum.

19. The apparatus of claim 16, wherein the shelf defines a space above the anode.

20. The apparatus of claim 19, wherein the shelf further defines a space around a perimeter of the anode.

21. The apparatus of claim 20, wherein each space allows the anode to expand and contract without bowing in response to varying temperatures during operation of the electron beam apparatus.

22. An electron beam apparatus, comprising:
a vacuum chamber, wherein an interior portion of the vacuum chamber is one of bead blasted, roughened, anodized or darkened;
a large-area cathode disposed in the vacuum chamber;
a first power supply connected to the cathode, wherein the first power supply is configured to apply a negative voltage to the cathode sufficient to cause the cathode to emit electrons toward a substrate disposed in the vacuum chamber;
an anode freely positioned between the large-area cathode and the substrate on an inwardly projecting shelf; and
a second power supply connected to the anode, wherein the second power supply is configured to apply a voltage to the anode that is positive relative to the voltage applied to the cathode.

23. The apparatus of claim 22, wherein an interior portion of the vacuum chamber has an absorptivity of greater than about 0.5.

24. The apparatus of claim 22, wherein the first power supply is configured to apply a voltage ranging from about −1000 volts to about −30,000 volts.

25. The apparatus of claim 22, wherein the second power supply is configured to apply a voltage ranging from about 0 volts to about −250 volts.

26. The apparatus of claim 22, wherein the anode defines a plurality of holes disposed therethrough.

27. The apparatus of claim 26, wherein the plurality of holes has a diameter that gradually decreases from a center of the anode to an edge of the anode.

28. The apparatus of claim 26, wherein the plurality of holes has a diameter that gradually increases from a center of the anode to an edge of the anode.

29. The apparatus of claim 22, wherein the shelf is electrically isolated from the anode and the vacuum chamber.

30. The apparatus of claim 29, wherein the shelf defines a space around a perimeter of the anode.

31. The apparatus of claim 29, wherein at least one of the vacuum chamber, the large-area cathode or the shelf is made from aluminum.

32. The apparatus of claim 29, wherein the shelf defines a space above the anode.

33. The apparatus of claim 32, wherein the shelf further defines a space around a perimeter of the anode.

34. The apparatus of claim 33, wherein each space allows the anode to expand and contract without bowing in response to varying temperatures during operation of the electron beam apparatus.

35. An electron beam apparatus, comprising:
a vacuum chamber;
a large-area cathode disposed in the vacuum chamber;
a first power supply connected to the cathode, wherein the first power supply is configured to apply a negative voltage to the cathode sufficient to cause the cathode to emit electrons toward a substrate disposed in the vacuum chamber;
an anode placed between the large-area cathode and the substrate;
an electrically isolated shelf disposed in the vacuum chamber, wherein the shelf defines a surface on which the anode is placed is inwardly projecting and; and
a second power supply connected to the anode, wherein the second power supply is configured to apply a voltage to the anode that is positive relative to the voltage applied to the cathode.

36. The apparatus of claim 35, wherein the shelf defines a space around a perimeter of the anode.

37. The apparatus of claim 35, wherein at least one of the vacuum chamber, the large-area cathode or the shelf is made from aluminum.

38. The apparatus of claim 35, wherein an interior portion of the vacuum chamber is one of bead blasted, roughened, anodized or darkened.

39. The apparatus of claim 35, wherein an interior portion of the vacuum chamber has an absorptivity of greater than about 0.5.

40. The apparatus of claim 35, wherein the first power supply is configured to apply a voltage ranging from about −1000 volts to about −30,000 volts.

41. The apparatus of claim 35, wherein the second power supply is configured to apply a voltage ranging from about 0 volts to about −250 volts.

42. The apparatus of claim 35, wherein the anode defines a plurality of holes disposed therethrough.

43. The apparatus of claim 42, wherein the plurality of holes has a diameter that gradually decreases from a center of the anode to an edge of the anode.

44. The apparatus of claim 42, wherein the plurality of holes has a diameter that gradually increases from a center of the anode to an edge of the anode.

45. The apparatus of claim 35, wherein the shelf defines a space above the anode.

46. The apparatus of claim 45, wherein the shelf further defines a space around a perimeter of the anode.

47. The apparatus of claim 46, wherein each space allows the anode to expand and contract in response to varying temperatures during operation of the electron beam apparatus.

* * * * *

UNITED STATES PATENT AND TRADEMARK OFFICE
CERTIFICATE OF CORRECTION

PATENT NO. : 6,831,284 B2
APPLICATION NO. : 10/301508
DATED : December 14, 2004
INVENTOR(S) : Alexandros T. Demos et al.

It is certified that error appears in the above-identified patent and that said Letters Patent is hereby corrected as shown below:

In the Claims

Column 6, Line 58: Insert --configured-- after "supply is"

Column 8, Line 43: Insert --is inwardly projecting and-- after "wherein the shelf"

Column 8, Line 44: Delete "is inwardly projecting and" after "placed"

Signed and Sealed this

Eighth Day of August, 2006

JON W. DUDAS
*Director of the United States Patent and Trademark Office*